US006297701B1

(12) United States Patent
Visocchi et al.

(10) Patent No.: US 6,297,701 B1
(45) Date of Patent: Oct. 2, 2001

(54) WIDE DYNAMIC RANGE TRANSIMPEDANCE AMPLIFIER

(75) Inventors: Pasqualino Michelle Visocchi, Enfield; Robin M Flett, Bishops Stortford, both of (GB)

(73) Assignee: Nortel Networks Limited, St. Laurent (CA)

(*) Notice: Subject to any disclaimer, the term of this patent is extended or adjusted under 35 U.S.C. 154(b) by 0 days.

(21) Appl. No.: 09/362,608

(22) Filed: Jul. 28, 1999

(30) Foreign Application Priority Data

Jul. 29, 1998 (GB) ....... 9816529

(51) Int. Cl.[7] ....... H03F 3/08; H01J 40/14

(52) U.S. Cl. ....... 330/308; 330/282; 250/214 A

(58) Field of Search ....... 330/86, 110, 308, 330/282; 250/214 A; 4/254

(56) References Cited

U.S. PATENT DOCUMENTS 4,540,952 * 9/1985 Williams ....... 330/85
5,012,202 * 4/1991 Taylor ....... 330/308
5,412,346 * 5/1995 Burger, Jr. et al. ....... 330/282
5,451,904 * 9/1995 Terada et al. ....... 330/282
5,786,730 * 7/1998 Hadley ....... 330/308
6,081,603 * 6/2000 Engh et al. ....... 330/282
6,114,686 * 9/2000 Funahashi ....... 330/282

* cited by examiner

*Primary Examiner*—Robert Pascal
*Assistant Examiner*—Khanh Van Nguyen
(74) *Attorney, Agent, or Firm*—Lee, Mann, Smith, McWilliams, Sweeney & Ohlson

(57) ABSTRACT

An integrated circuit transimpedance amplifier for an optical receiver is formed by a bipolar process comprising fixed value resistive elements in a network to provide AGC. The resistive elements are arranged in a parallel configuration and a transistor switching network is provided to enable at least one of said elements to be isolated from a gain stage of the amplifier thereby providing a means of varying amplifier gain.

12 Claims, 4 Drawing Sheets

WIDE DYNAMIC RANGE TRANSIMPEDANCE AMPLIFIER

FIELD OF THE INVENTION

The present invention relates to a wide dynamic range transimpedance amplifier which finds application in optical receivers. The invention particularly relates to a bipolar IC transimpedance amplifier.

BACKGROUND OF THE INVENTION

The ever increasing demands for high capacity communications systems has seen the wide spread employment of optical fibre networks across the world. A fundamental component for such systems is a means of converting optical pulses comprising a digital bit stream into electrical signals. This component of such a system is commonly known as an optical receiver.

The operational requirements of such a receiver are very demanding. The receiver is required to exhibit a very low noise characteristic, such that it is capable of detecting very low levels of optical input in systems employing maximum optical fibre lengths, thus requiring high gain amplification for maximum sensitivity, but is conversely required to cope with high levels of optical input in systems employing short fibre lengths, thus requiring low gain amplification. As such, the optical receiver is required to have a wide dynamic range which can only be practically achieved with some form of automatic gain control (AGC). A typical integrated circuit (IC) optical receiver 10 is illustrated in block schematic form in FIG. 1. This comprises an IC (denoted by broken line 12) including a transimpedance amplifier stage (denoted by broken line 14) with an integrator in a control loop providing AGC.

As illustrated by FIG. 1, optical input power $OP_{IN}$ is converted into an electrical current $I_{IN}$ by a PIN diode photodetector 16. This current $I_{IN}$ is applied as an input to the IC optical receiver 10. The input current $I_{IN}$ is amplified by a transimpedance amplifier (Tz Amp) 18 which converts the input current $I_{IN}$ into an amplified voltage output signal $V_{OUT}$. To meet the requirement of wide dynamic range the output voltage $V_{OUT}$ of the Tz Amp 18 which is in the form of a broadband data signal and may be considered as an ac, multi-frequency signal, is rectified or peak detected by a rectifier/peak detector 20 to provide a dc signal level $V_{REC}$ for comparison with a pre-determined dc reference voltage $V_{REF}$. The difference between the rectified/peak detected output voltage $V_{REC}$ and the reference voltage $V_{REF}$ is considered as an error signal which is amplified and integrated by a Miller Integrator 22 to provide a control signal $V_{CONTROL}$. A Miller Integrator is a well known form of integrator incorporating an active device such as a transistor amplifier. The Miller Integrator 22 is required to have a high gain, in order to ensure that the error signal approaches zero (ie in order to ensure that the difference between the rectified/peak detected output voltage $V_{REC}$ and the reference voltage $V_{REF}$ becomes zero) by means of controlling the gain of the Tz Amp by varying the impedance of a feedback resistor 24.

If the rectified/peak detected output voltage $V_{REC}$ is smaller than the dc reference voltage $V_{REF}$, then the Tz Amp 18 must operate at high gain to provide high sensitivity of the optical receiver. When the rectified/peak detected output voltage $V_{REC}$ becomes just greater than the dc reference voltage $V_{REF}$, then the on-set of AGC occurs and continues whilst the input channel $I_{IN}$ increases. When the feedback resistor 24 is at a minimum the Tz Amp is operating at very low gain and approaches an overload condition.

The most effective method of controlling the gain of the Tz Amp 18 is to vary the value Rf of the feedback resistor 24, as shown by FIG. 1. This can be achieved when using such technologies as CMOS, BiCMOS or GaAs MESFET were the availability of Field Effect Transistors (FETs) allows them to be configured as variable resistors connected in parallel with the feedback resistor 24 to vary the Tz Amp gain. To achieve the highest performance receiver GaAs MESFET technology is often used but at greatest expense. Alternatively, CMOS technology can offer the lowest cost but offers the poorest performance in terms of sensitivity. A good compromise is often provided by using BiCMOS technology, where a high performance is achieved through use of bipolar transistors for low noise while the gain control is achieved by the FET connected in parallel with the feedback resistor. The use of bipolar technology can achieve sensitivities comparable to GaAs MESFET technology, but poor gain control techniques may result in either lowering of the sensitivity of the receiver or providing an inadequate dynamic range.

OBJECTS OF THE INVENTION

The invention seeks to provide a bipolar IC transimpedance amplifier including gain control.

The invention also seeks to provide a bipolar IC transimpedance amplifier which obviates some of the problems encountered with other IC transimpedance amplifiers.

SUMMARY OF THE INVENTION

The present invention provides a transimpedance amplifier for an optical receiver comprising an input for receiving an input current signal from a photodetector and a gain stage for amplifying the input current signal. It also comprises a resistor network coupling the output and input of the gain stage, the resistor network comprising at least first and second resistive elements in a parallel arrangement and being arranged such that one of said resistive elements can be isolated from the output of the gain stage wherein the one of said resistive elements can be isolated from the output of the gain stage by means of a transistor switching network.

BRIEF DESCRIPTION OF THE DRAWINGS

For a better understanding of the invention and to show how the same may be carried into effect, there will now be described by way of example only preferred embodiments with reference to the accompanying drawings of which.

DETAILED DESCRIPTION OF PREFERRED EMBODIMENTS

Figure 1:
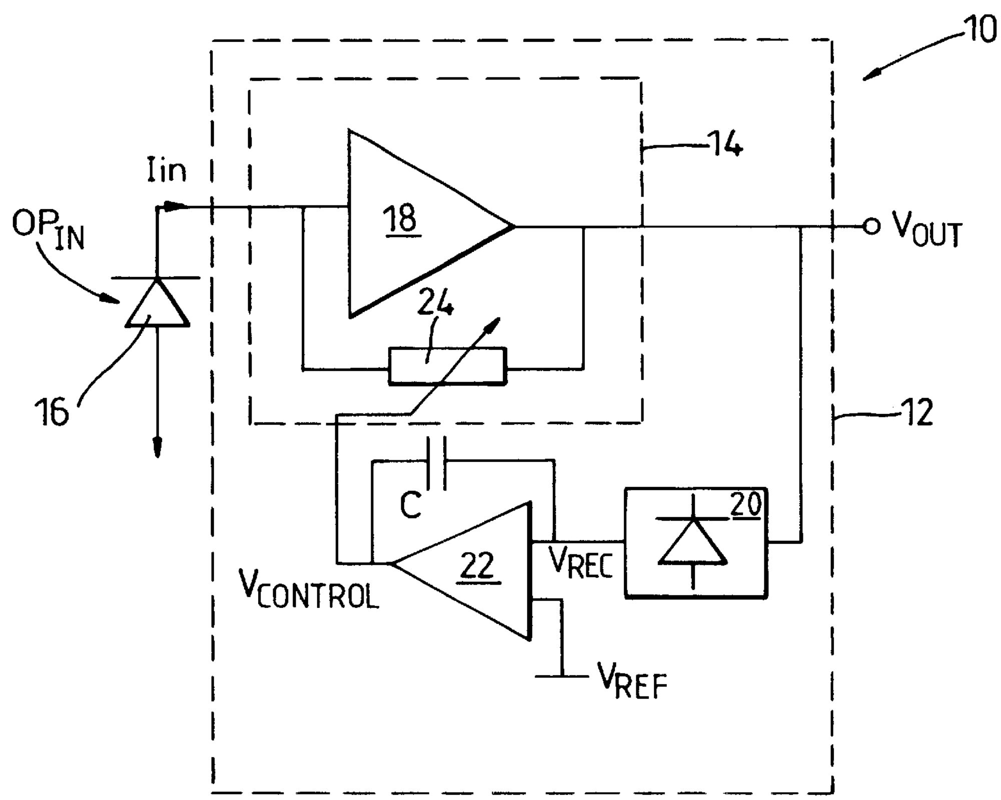
FIG. 1 is a block schematic diagram of a typical IC optical receiver with automatic gain control (AGC)

In a practical implementation of an optical receiver, FIG. 1 is an oversimplification used to illustrate the general principles of operation. A more detailed design of a practical realisation of an optical receiver with AGC in accordance with the invention is shown in FIG. 2.

The integrated circuit optical receiver 30 includes a Tz Amp 32 to amplify an input current $I_{IN}$ received from a photodetector 34. As in the typical receiver illustrated in FIG. 1, the receiver 30 includes a rectifier/peak detector 36 and integrator 38 in a control loop for providing AGC. However, the receiver 30 also includes a dummy Tz Amp 40 and a 50Ω line driver 42 which provides a differential output $V_{DIFF}$.

Figure 2:
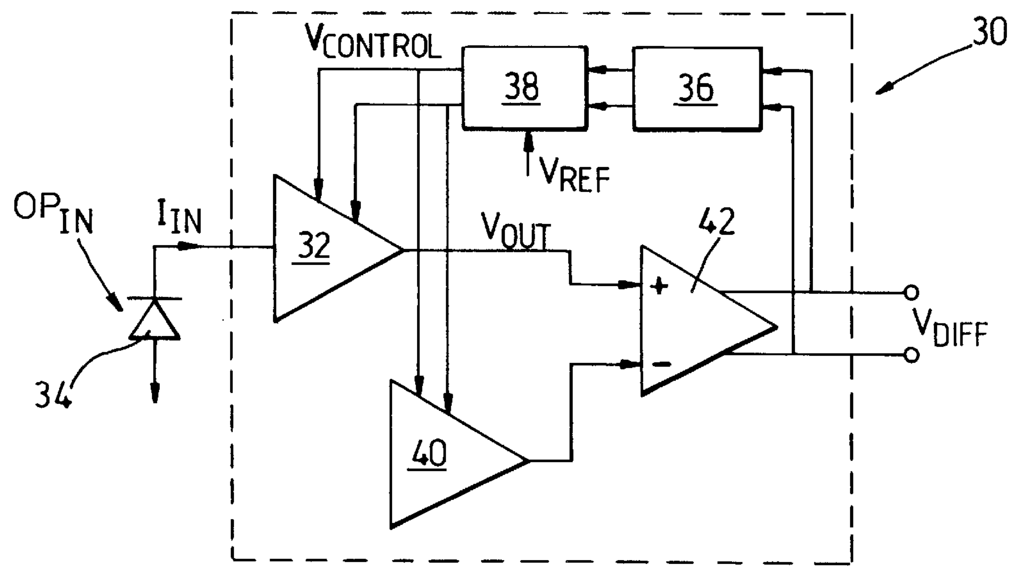
FIG. 2 is a block schematic diagram of a practical implementation of an optical receiver in accordance with the invention.

As indicated in FIG. 2, the Tz Amp 32 and Dummy Tz Amp 40 are of the same type differing only in that the Dummy Tz Amp 40 is not connected to any input. Its purpose is to provide the correct DC voltage to bias the 50Ω line driver 42. The 50Ω line driver 42 may be a long tail pair configuration with 50Ω collector resistors to interface to the outside world. In addition, the long tail pair configuration converts the single ended signal from the Tz Amp 32 into a differential signal at the output. This output differential signal is rectified/peak detected and compared to a reference DC voltage to determine the correct output signal level required for AGC. The output of the rectifier/peak detector 36 is applied to the integrator 38 to provide the required control voltages to both the Tz Amp 32 and Dummy Tz Amp 40, thus maintaining a DC match at the input of the 50Ω line driver. An additional requirement of the integrator 38 is to provide a long time constant to prevent pattern dependent jitter of the digital data.

Figure 3:
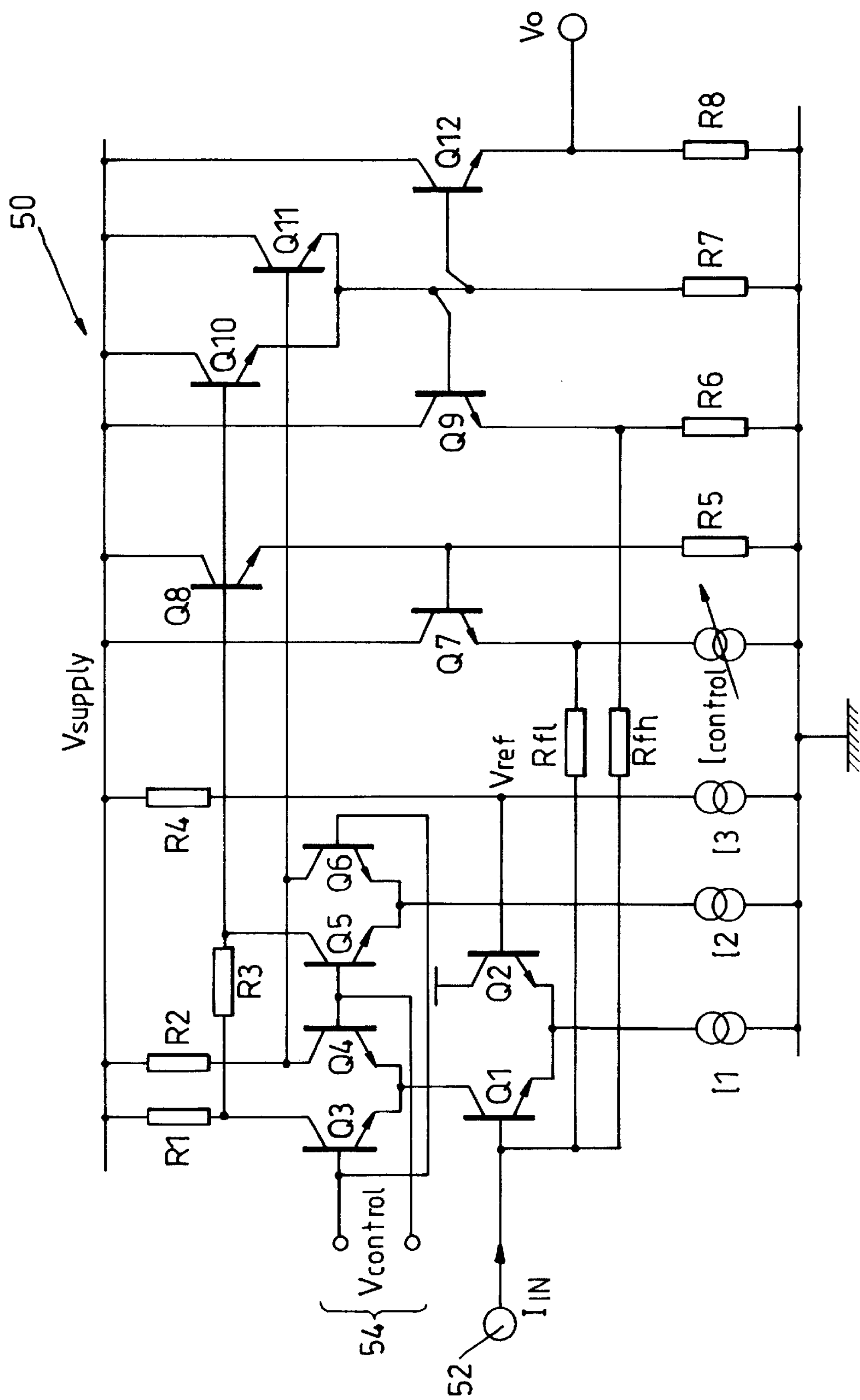
FIG. 3 is a circuit diagram for a transimpedance amplifier in accordance with the invention.

Referring to FIG. 3, a first embodiment of a bipolar IC transimpedance amplifier 50 comprises an input 52 for receiving an input current $I_{IN}$ signal from an optical receiver photodetector (FIG. 2) such as a PIN diode and a gain stage comprising first and second transistors Q1, Q2 for amplifying said input current signal $I_{IN}$ to provide an output voltage signal $V_{OUT}$. The gain stage includes a feedback loop coupling its output and input comprising a parallel network of feedback resistors Rfh and Rfl. Rfh has a value of resistance considerably larger than Rfl, in the order of 100:1. The feedback resistive network establishes the gain of the gain stage. As such, the network includes a transistor switching stage which enables the low value resistive element Rfl to be isolated from the gain stage input leaving only the high valve resistive element Rfh in circuit thus establishing high gain operation. The circuit also includes a second input 54 which receives an input voltage control signal $V_{CONTROL}$ to control the transistor switching network. The voltage control signal $V_{CONTROL}$ is taken from the optical receiver integrator stage (FIG. 2). The input control voltage $V_{CONTROL}$ determines by its action on the transistor switching network whether the low value resistive element Rfl is isolated from the gain stage input or switched in circuit.

As shown in FIG. 3, if high gain, high sensitivity is required from the transimpedance amplifier, the control voltage (Vcontrol provided by the rectifier and integrator shown in FIG. 2) would be biased to turn on fully transistors Q4 and Q5 while turning off transistors Q3 and Q6. This would result in current flow through transistor Q1 determined by the collector resistor R2. Conversely, since Q5 is turned on the current 12 would flow through resistors R1 and R3 provided just the required voltage drop to turn off transistors Q8, Q10 and in turn Q7. In addition a control current connected to the emitter of Q7 would also be turned off, isolating the feedback resistor Rfl. While current flows through R2, transistor Q11 is biased on and connected to the feedback resistor Rfh via the emitter follower formed by transistor Q9 and resistor R6. Thus the transimpedance gain would be determined by the value of Rfh. The current source 13 and the resistor R4 provides the DC bias for the input of the transimpedance amplifier so that the PIN diode detector may be reversed biased. Under these conditions the current flowing in Q1 would be set to provide the lowest noise for maximum sensitivity and the majority of the current of 11 would flow through transistor Q2 to provide a virtual ac earth. The transistor Q12 and resistor R8 form an emitter follower output drive for the next stage.

In the above circuit diagram, it is important to carefully choose the values of resistors R1, R2 and R3 such that R2>R1 and R1+R3≅R2.

When the input current has reached a signal level requiring gain control, the dc control voltage 'Vcontrol', would begin to increase the current in Q1 by allowing current to flow in R1 and R2 while lowering the voltage drop across R1 and R3 by allowing a proportion of current 12 to flow through Q6. This would in turn begin the turn on the transistors Q8 and Q7 provided that the control current, 'Icontrol' also begins to allow current flow through transistor Q7. Since transistors Q10 and Q11 are effectively an analogue OR function, feedback is always applied to the base of Q1 via Rfh, thus the emitter of Q7 would approximately remain at a constant DC bias point. This has the effect of controlling the impedance seen by Q7 determined by re=VT/Icontrol, where VT is the thermal voltage (KT/e). By controlling re which appears in series with Rfl, the high gain feedback resistance is shunted by the combination of Rfl+ re.

Under very high input current levels, Vcontrol would be such that transistors Q3 and Q6 would be fully turned on while transistors Q4 and Q5 would be turned off. This would result in current flow through transistor Q1 determined by the collector resistor R1. Conversely, since Q6 is turned on the current I2 would flow through resistor R2 only, which allows transistors Q8, Q10 and in turn Q7 to be fully on since Icontrol would also be fully on. Under these conditions, re of transistor Q7 would be small compared to Rfl and Rfl would be small compared to Rfh, thus the transimpedance gain would be determined by the value of Rfl. It is important to note that for correct gain control to be achieved, the ratio of change in current from transistors Q3 to Q4 must be represented by the correct transistor ratio of Q3 and Q4.

Figure 4:
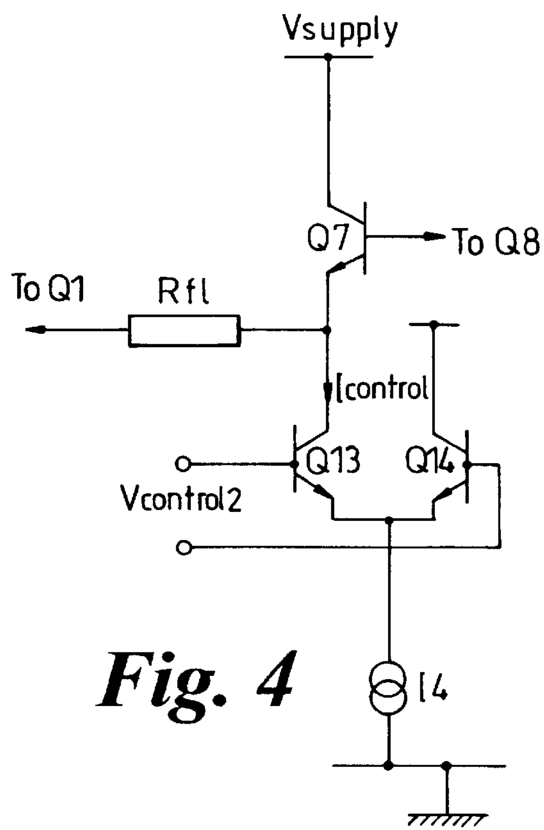
FIG. 4 is a circuit diagram illustrating a first configuration of a current control for the amplifier of FIG. 3.
Figure 5:
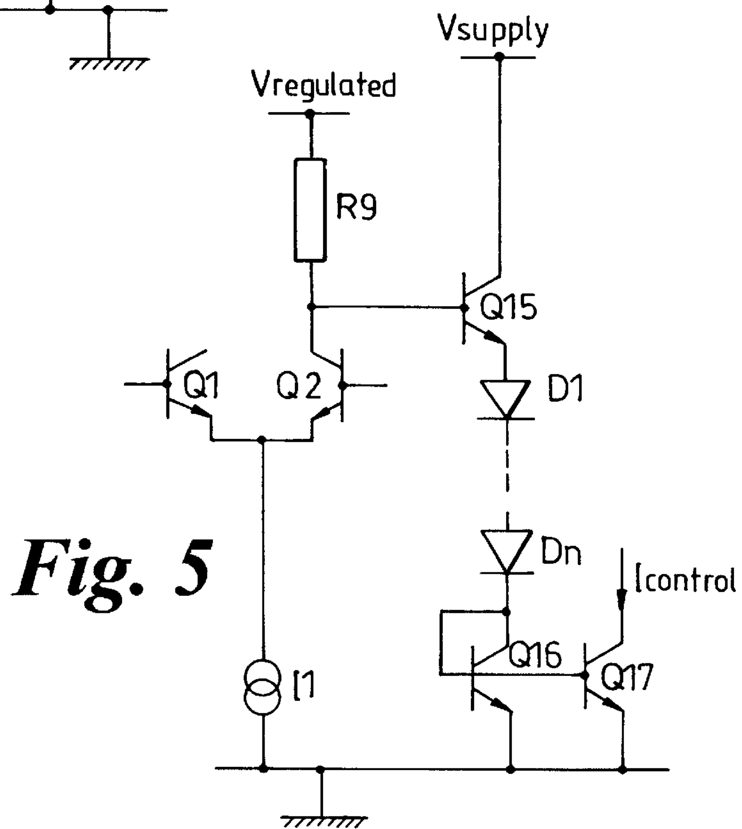
FIG. 5 is a circuit diagram of a second configuration of a current control for the amplifier of FIG. 3.

There are various ways that Icontrol in FIG. 3 may be achieved as illustrated by FIGS. 4 and 5.

In FIG. 4, Icontrol is achieved by the use of a long tail pair driven by a control signal Vcontrol2 which would be derived by Vcontrol (in FIG. 2) differing by a common mode voltage of only two diode drops (ie 2vbe). When Vcontrol was steering the current through transistors Q3, Q4 and Q5, Q6, the derived Vcontrol2 would be steering the current I4 from transistor Q14 into transistor Q13, thus increasing the current through the control transistor Q7. Alternatively, FIG. 5 uses the action of change of current through transistor Q2 during gain control. When high gain is required the transistor Q2 delivers a maximum collector current which in turn provides a voltage drop across R9. This in turn would be designed to turn off the transistor Q15 via diodes D1 to Dn thus preventing current flow by the current mirror formed by transistors Q16 and Q17. As gain control is required the current at the collector of transistor Q2 reduces, thus reducing the voltage drop across resistor R9. This in turn allows the transistor Q15 via diodes D1 to Dn to turn on and provide the required current flow to start via the current mirror formed by transistors Q16 and Q17, providing Icontrol. The regulated voltage supply 'Vregulated' in FIG. 5 is required to prevent the activation of the gain control by the supply voltage variation.

Figure 6:
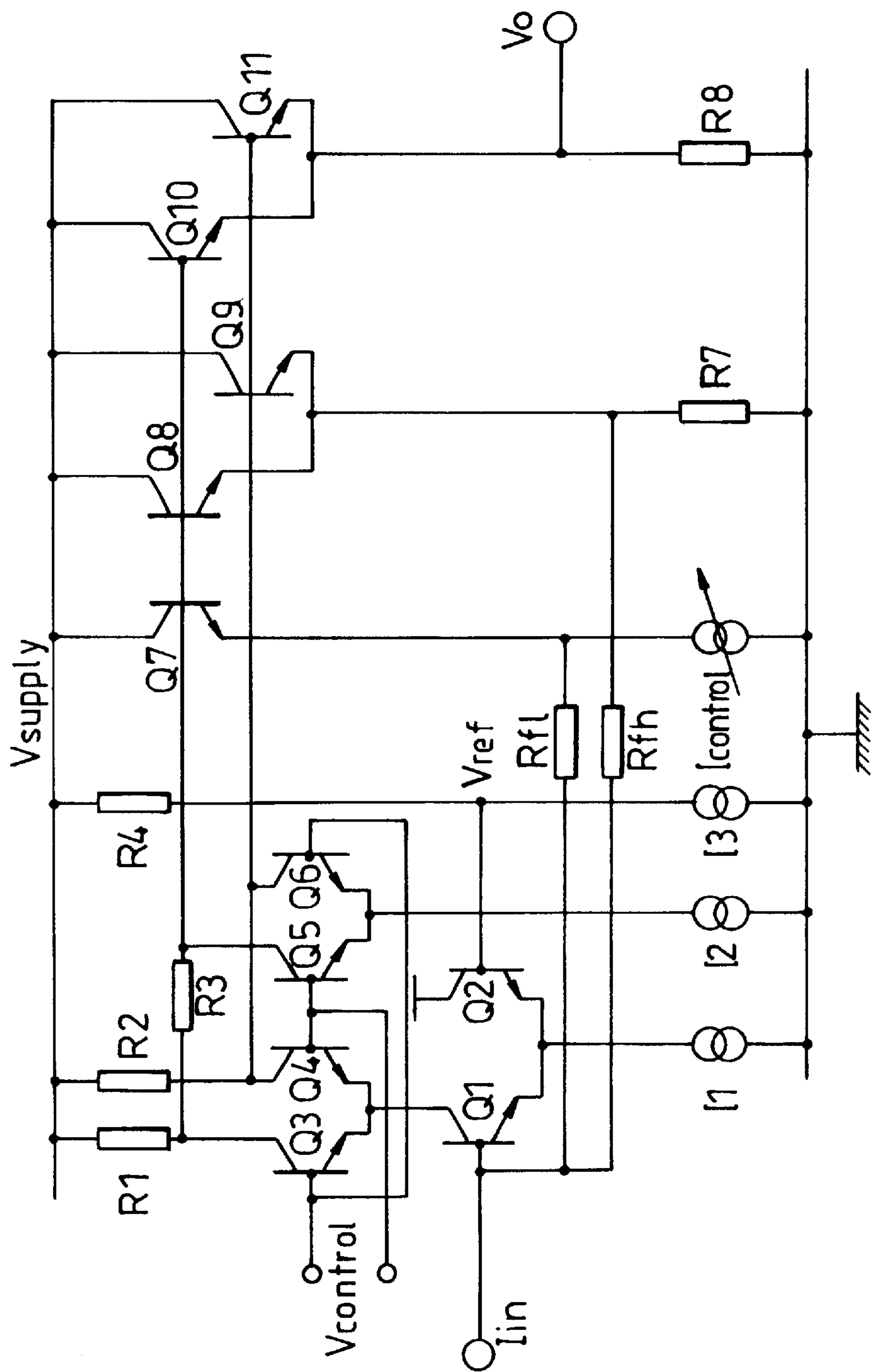
FIG. 6 is a circuit diagram of a second embodiment of a transimpedance amplifier in accordance with the invention.

The transimpedance amplifier with gain control illustrated in FIG. 3 may be re-configured to operate with reduced voltage supply as shown by FIG. 6.

The basic principles of operation of the gain control technique are the same as FIG. 3 with the exception that the control transistor Q8 in FIG. 3 which provided an additional vbe drop to transistor Q7 is not required. In addition, a parallel analogue OR function (Q10 and Q11 in FIG. 6) is required to buffer the effects of the next stage from feedback resistors formed by resistors Rfl and Rfh. This function was performed by the emitter follower of Q12 and R8 in FIG. 3.

What is claimed is:

1. A bipolar integrated circuit (IC) transimpedance amplifier for an optical receiver comprises:

an input for receiving an input current signal from a photo detector;

a gain stage for amplifying the input current; and a resistor network coupling the output and the input for receiving an input current_signal of the gain stage, the resistor network comprising at least first and second resistive elements in a parallel arrangement and being arranged such that one of said resistive elements can be isolated from the output of the gain stage by means of a transistor switching network.

2. A transimpedance amplifier as claimed in claim 1, wherein the transistor switching network is responsive to a voltage control signal from an integrator circuit.

3. A transimpedance amplifier as claimed in claim 1, wherein the bipolar IC transimpedance amplifier is formed of npn devices.

4. A transimpedance amplifier as claimed in claims 1, 2 or 3, wherein the value of the first resistive element is considerably greater than that of the second resistive element.

5. A transimpedance amplifier as claimed in claims 1, 2 or 3, wherein the resistive network includes a current source in the branch of the second resistive element.

6. A transimpedance amplifier as claimed in claim 5, wherein the current source comprises a long tail pair transistor configuration.

7. A transimpedance amplifier as claimed in claim 5, wherein the current source comprises a current mirror transistor configuration.

8. An optical receiver for a telecommunications system comprising:

a transimpedance amplifier having an input for receiving an input current signal from a photo detector, a gain stage for amplifying the input current and a resistor network coupling the output and the input for receiving an input current signal of the gain stage, the resistor network comprising at least first and second resistive elements in a parallel arrangement and being arranged such that one of said resistive elements can be isolated from the output of the gain stage by means of a transistor switching network; and an integrator circuit for providing a voltage control signal for controlling the transistor switching network.

9. An optical receiver as claimed in claim 8, wherein the reciever is fully integrated on an integrated circuit (IC) chip by means of a bipolar process.

10. An optical receiver as claimed in claim 8, wherein the impedance value of the first resistive element is considerably greater than the impedance value of the second resistive element.

11. An optical receiver as claimed in claim 10, wherein the impedance value of the first resistive element is in the order of 100 times greater than that of the second resistive element.

12. An optical receiver as claimed in claim 8, wherein the resistive network includes a current source in the branch of the second resistive element.

* * * * *